(12) United States Patent
Boon et al.

(10) Patent No.: US 9,535,340 B2
(45) Date of Patent: Jan. 3, 2017

(54) SUPPORT FOR A MOVABLE ELEMENT AND LITHOGRAPHY APPARATUS

(71) Applicant: ASML Netherlands B.V., Veldhoven (NL)

(72) Inventors: Fidelus Adrianus Boon, Bavel (NL); Sven Antoin Johan Hol, Eindhoven (NL); Olof Martinus Josephus Fischer, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 43 days.

(21) Appl. No.: 14/413,667

(22) PCT Filed: May 15, 2013

(86) PCT No.: PCT/EP2013/059999
§ 371 (c)(1),
(2) Date: Jan. 8, 2015

(87) PCT Pub. No.: WO2014/009042
PCT Pub. Date: Jan. 16, 2014

(65) Prior Publication Data
US 2015/0205210 A1    Jul. 23, 2015

Related U.S. Application Data

(60) Provisional application No. 61/671,000, filed on Jul. 12, 2012.

(51) Int. Cl.
G03B 27/54     (2006.01)
G03F 7/20      (2006.01)
F16C 32/04     (2006.01)

(52) U.S. Cl.
CPC ....... *G03F 7/70833* (2013.01); *F16C 32/0459* (2013.01); *G03F 7/704* (2013.01); *G03F 7/70058* (2013.01); *G03F 7/70816* (2013.01)

(58) Field of Classification Search
CPC ......... F16C 32/0459–32/0474; G03F 7/70058; G03F 7/704; G03F 7/70816; G03F 7/70825; G03F 7/70833; G03F 7/70758; G03F 7/70766; G03F 7/70775; G03F 7/70725; G03F 7/70733; G03F 7/70983
(Continued)

(56) References Cited

U.S. PATENT DOCUMENTS 4,322,624 A    3/1982    Cornelissen et al.
4,634,191 A    1/1987    Studer
(Continued)

FOREIGN PATENT DOCUMENTS

JP    2005-294837    10/2005
JP    2010-114212    5/2010
(Continued)

OTHER PUBLICATIONS

International Search Report and Written Opinion mailed Jul. 31, 2013 in corresponding International Patent Application No. PCT/EP2013/059999.
(Continued)

*Primary Examiner* — Christina Riddle
(74) *Attorney, Agent, or Firm* — Pillsbury Winthrop Shaw Pittman LLP

(57) ABSTRACT

A support for a movable element includes a stator element, a gravity compensator field inducing element mounted on the stator element, the gravity compensator field inducing element configured to apply a translational force to the movable element by controlling a magnetic field in a gap between the stator element and the movable element, and a plurality of torque compensator field inducing elements mounted on the stator element, the torque compensator field (Continued)

inducing elements configured to apply a torque to the movable element by controlling a magnetic field in the gap between the stator element and the movable element, the torque being about a first axis substantially perpendicular to the direction of the translational force applied by the gravity compensator field inducing element.

20 Claims, 8 Drawing Sheets

(58) Field of Classification Search
USPC .... 355/52, 53, 55, 67–77; 250/492.1, 492.2, 250/492.22, 493.1, 548
See application file for complete search history.

(56) References Cited

U.S. PATENT DOCUMENTS

| | | | |
|---|---|---|---|
| 5,294,854 A | 3/1994 | Trumper | |
| 6,191,513 B1* | 2/2001 | Chen | F16C 32/0444 310/51 |
| 6,445,093 B1* | 9/2002 | Binnard | G03F 7/70716 250/491.1 |
| 7,053,981 B2 | 5/2006 | Bleeker | |
| 2005/0219497 A1 | 10/2005 | Bleeker | |
| 2006/0265889 A1* | 11/2006 | Lof | G03F 7/70791 33/1 M |
| 2007/0018604 A1 | 1/2007 | Montesanti et al. | |
| 2009/0009742 A1 | 1/2009 | Arai | |
| 2009/0134734 A1 | 5/2009 | Nashiki | |
| 2011/0069293 A1 | 3/2011 | Hol et al. | |
| 2011/0188016 A1 | 8/2011 | De Jager et al. | |
| 2011/0267596 A1* | 11/2011 | Muehlberger | G03F 7/70825 355/67 |
| 2012/0019794 A1 | 1/2012 | Hol et al. | |
| 2014/0071421 A1 | 3/2014 | De Jager et al. | |
| 2014/0160452 A1 | 6/2014 | De Jager et al. | |

FOREIGN PATENT DOCUMENTS

| | | |
|---|---|---|
| JP | 2012-511821 | 5/2012 |
| WO | 2008/139964 | 11/2008 |
| WO | 2010/032224 | 3/2010 |
| WO | 2012/084675 | 6/2012 |

OTHER PUBLICATIONS

Sven Antoin Johan Hol, "Design and Optimization of a Magnetic Gravity Compensator," CIP-Data Library Technische Universiteit Eindhoven, 199 pages (May 24, 2004).

* cited by examiner

SUPPORT FOR A MOVABLE ELEMENT AND LITHOGRAPHY APPARATUS

CROSS-REFERENCE TO RELATED APPLICATIONS

This application is the U.S. national phase entry of PCT patent application no. PCT/EP2013/059999, which was filed on May 15, 2013, which claims the benefit of priority of U.S. provisional application No. 61/671,000, which was filed on Jul. 12, 2012, and which is incorporated herein in its entirety by reference.

FIELD

The present invention relates to a support for a movable element, a support system comprising a movable element and a support for the movable element, a lithographic or exposure apparatus comprising a projection system having a movable element and a support for the movable element, a method of supporting a movable element, and a device manufacturing method.

BACKGROUND

A lithographic or exposure apparatus is a machine that applies a desired pattern onto a substrate or part of a substrate. A lithographic or exposure apparatus may be used, for example, in the manufacture of integrated circuits (ICs), flat panel displays and other devices or structures having fine features. In a conventional lithographic or exposure apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices, a shutter element/matrix and the like. A programmable patterning device could also be formed from an electro-optical deflector, configured for example to move spots of radiation projected onto the substrate or to intermittently direct a radiation beam away from the substrate, for example to a radiation beam absorber. In either such arrangement, the radiation beam may be continuous.

SUMMARY

A lithographic or exposure apparatus may contain one or more movable elements. The movable element may be configured to rotate and/or undergo translational movement. In order to, for example, avoid or reduce friction associated with the movement, a gravity compensator may be provided to compensate all or a portion of the weight of the movable element. For example, the movable element may be suspended in a contactless manner below the gravity compensator. In an embodiment, the movable element may be levitated above the gravity compensator.

An approach to implementing a gravity compensator uses a permanent magnet (to compensate the constant force due to gravity) in combination with a Lorentz actuator (to compensate "AC" or varying forces). However, an error in the magnetization of the permanent magnet (for example in the direction of magnetization) may tend to cause an unwanted (parasitic) force. The parasitic force may have a component perpendicular to the direction of gravity for example. The parasitic force may cause a positioning error of the movable element and/or require a complex corrective measure to be employed. Furthermore, such an arrangement may generally cause a significant stray field, which may disrupt one or more other elements of the apparatus.

A reluctance actuator tends to have a lower parasitic force. However, the relationship between the gravity-opposing force and the current applied to the reluctance actuator is non-linear (for example, proportional to the square of the applied current) and it may be difficult to control a torque about one or more axes perpendicular to the gravity-opposing force applied by the actuator. Additionally, a reluctance actuator is prone to high negative stiffness (indicating that the gravity opposing force for a given applied field will tend to decrease relatively quickly with increasing gap size). The stiffness behaves in the manner of an additional coupling and can mediate a resonance and/or disturbance force.

It is desirable, for example, to address at least one of the problems mentioned above or one or more problems in the art.

According to an embodiment, there is provided a support for a movable element, comprising: a stator element; a gravity compensator field inducing element mounted on the stator element, the gravity compensator field inducing element configured to apply a translational force to the movable element by controlling a magnetic field in a gap between the stator element and the movable element; and a plurality of torque compensator field inducing elements mounted on the stator element, the torque compensator field inducing elements configured to apply a torque to the movable element by controlling a magnetic field in the gap between the stator element and the movable element, the torque being about a first axis substantially perpendicular to the direction of the translational force applied by the gravity compensator field inducing element.

According to an embodiment, there is provided an exposure apparatus, comprising: a projection system for projecting each of a plurality of radiation beams onto a target, the projection system comprising a stationary element and a movable element; a stator element; a gravity compensator field inducing element mounted on the stator element, the gravity compensator field inducing element configured to apply a translational force to the movable element by controlling a magnetic field in a gap between the stator element and the movable element; and a plurality of torque compensator field inducing elements mounted on the stator element, the torque compensator field inducing elements configured to apply a torque to the movable element by controlling a magnetic field in the gap between the stator element and the movable element, the torque being about a first axis perpendicular to the direction of the translational force applied by the gravity compensator field inducing element.

According to an embodiment, there is provided a method of supporting a movable element, comprising: driving a gravity compensator field inducing element mounted on a stator element to apply a translational force to the movable element by controlling a magnetic field in a gap between the stator element and the movable element; and driving a plurality of torque compensator field inducing elements mounted on the stator element to apply a torque to the movable element by controlling a magnetic field in the gap between the stator element and the movable element, the torque being about a first axis substantially perpendicular to the direction of the translational force applied by the gravity compensator field inducing element.

According to an embodiment, there is provided a device manufacturing method, comprising: projecting each of a plurality of radiation beams onto a target, the projection system comprising a stationary element and a movable element; driving a gravity compensator field inducing element mounted on a stator element to apply a translational force to the movable element by controlling a magnetic field in a gap between the stator element and the movable element; and driving a plurality of torque compensator field inducing elements mounted on the stator element to apply a torque to the movable element by controlling a magnetic field in the gap between the stator element and the movable element, the torque being about a first axis substantially perpendicular to the direction of the translational force applied by the gravity compensator field inducing element.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to an apparatus that may include a programmable patterning device that may, for example, be comprised of an array or arrays of self-emissive contrast devices. Further information regarding such an apparatus may be found in PCT patent application publication no. WO 2010/032224 A2, U.S. patent application publication no. US 2011-0188016, U.S. patent application Ser. No. 61/473,636 and U.S. patent application Ser. No. 61/524,190 which are hereby incorporated by reference in their entireties. An embodiment of the present invention, however, may be used with any form of programmable patterning device including, for example, those discussed above.

Figure 1:
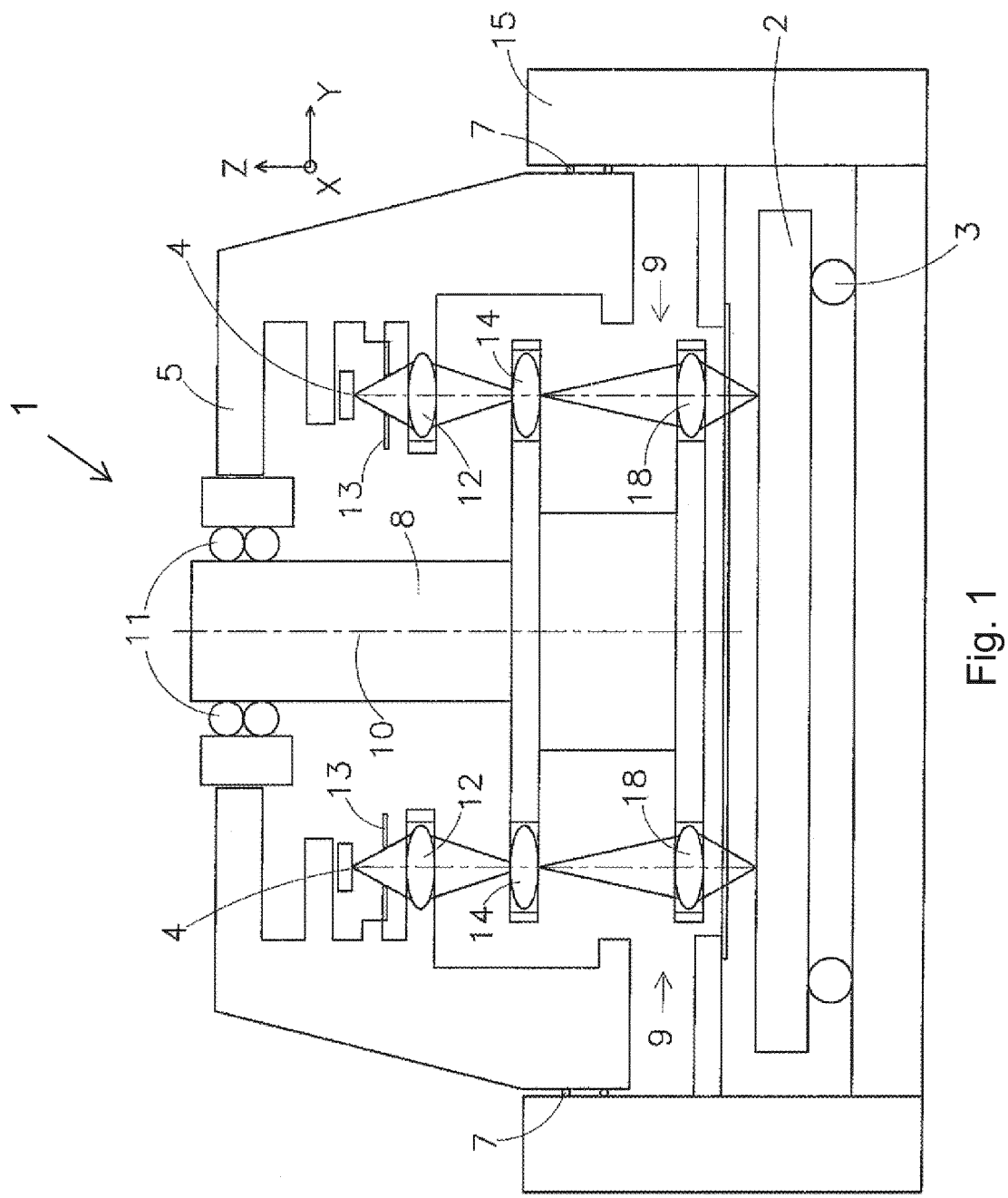
FIG. 1 depicts a part of a lithographic or exposure apparatus according to an embodiment of the invention.

FIG. 1 schematically depicts a schematic cross-sectional side view of a part of a lithographic or exposure apparatus. In this embodiment, the apparatus has individually controllable elements substantially stationary in the X-Y plane as discussed further below although it need not be the case. The apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2 \cdot$sr).

Figure 2:
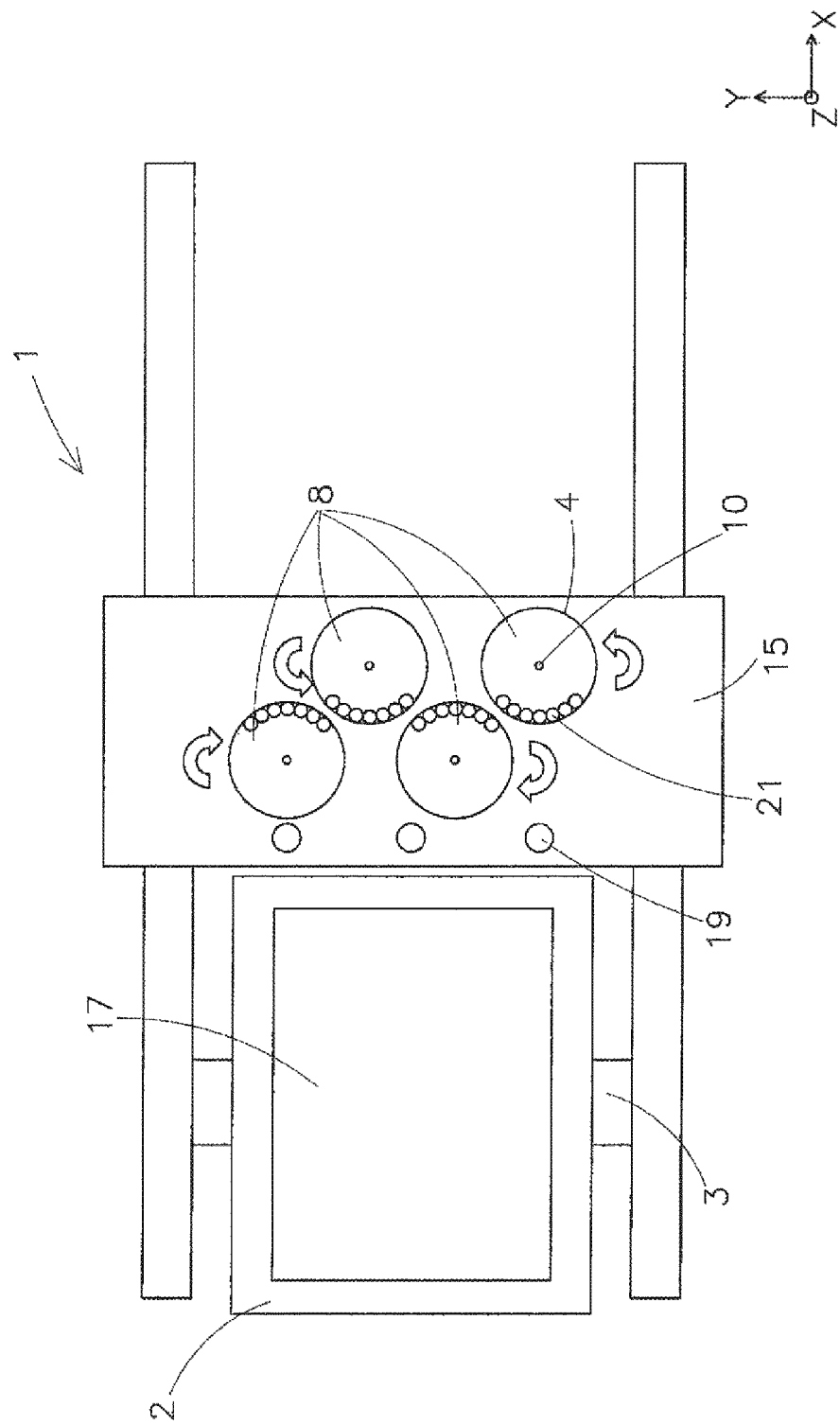
FIG. 2 depicts a top view of a part of the apparatus of FIG. 1 according to an embodiment of the invention.

The self-emissive contrast devices 4 are arranged on a frame 5 and may extend along the Y-direction and/or the X direction. While one frame 5 is shown, the apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The apparatus 1 may comprise an actuator (e.g. motor 11) to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator e.g. motor 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the apparatus of FIG. 1 having self-emissive contrast devices 4. Like the apparatus 1 shown in FIG. 1, the apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
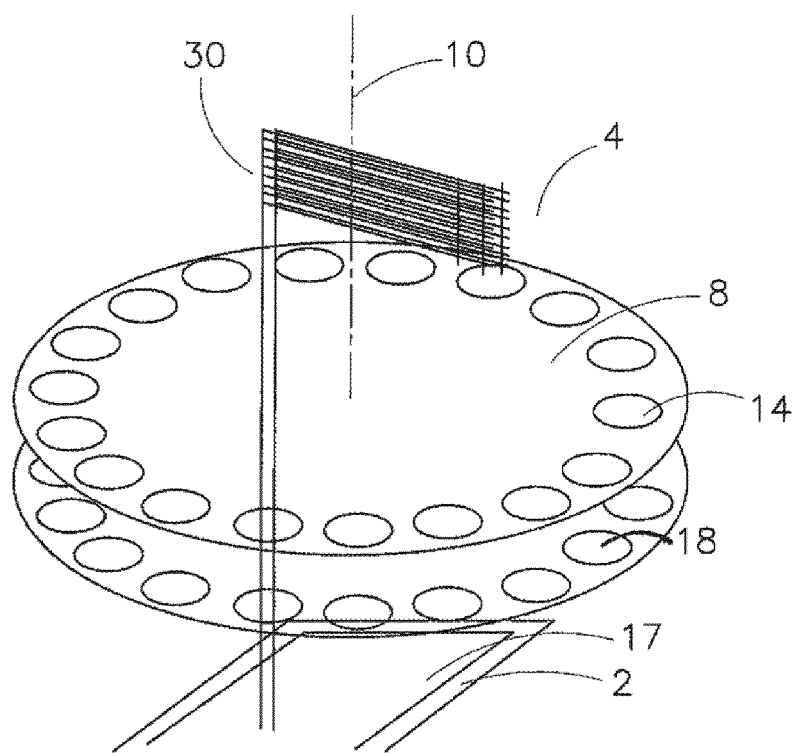
FIG. 3 depicts a highly schematic, perspective view of a part of a lithographic or exposure apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
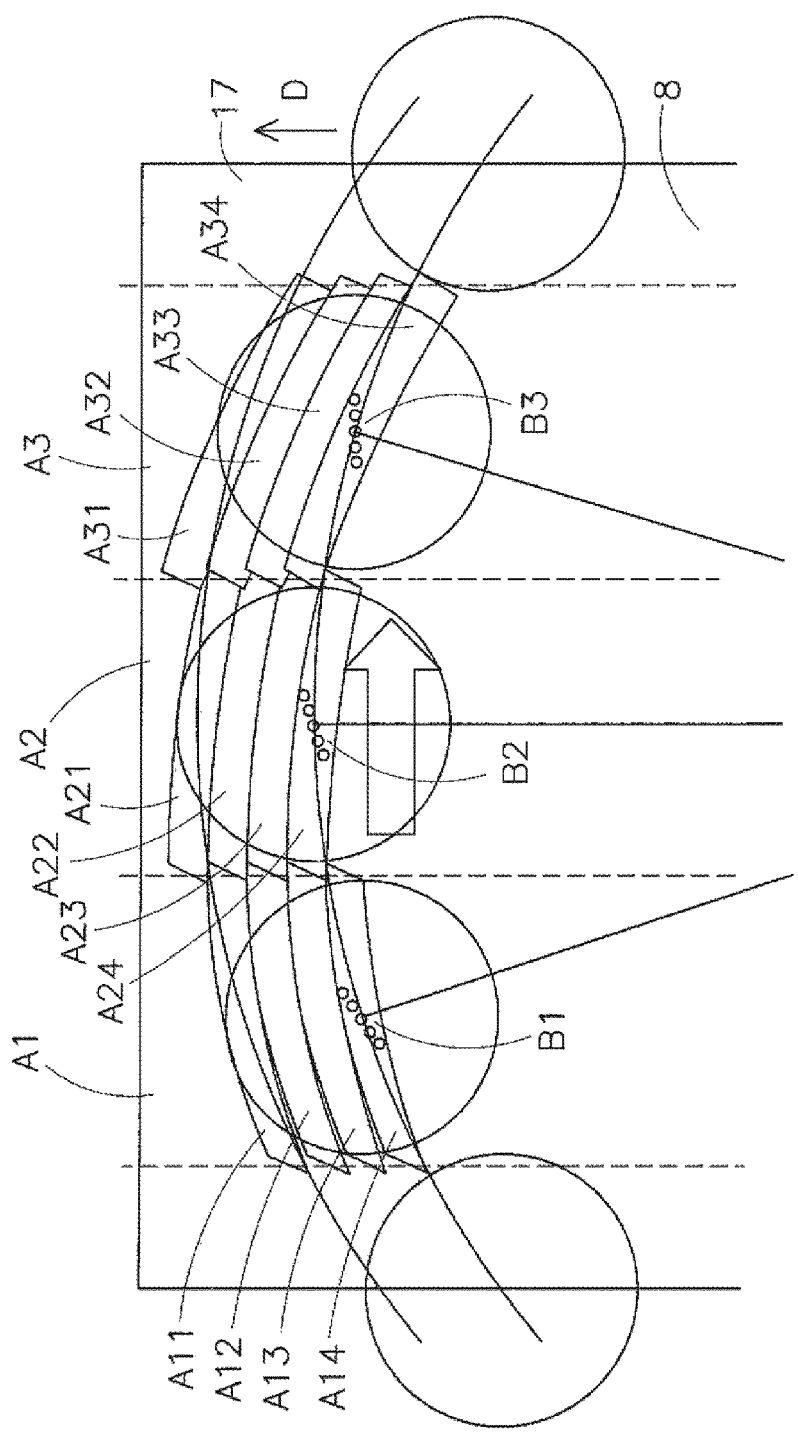
FIG. 4 depicts a schematic top view of projections by the apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2), thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, areas A21, A22, A23 and A24 (areas A21, A22, A23 being previously scanned and A24 being currently scanned as shown in FIG. 4) for beams B2 and areas A31, A32, A33 and A34 (areas A31, A32, A33 being previously scanned and A34 being currently scanned as shown in FIG. 4) for beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A1, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) by a laser induced material transfer.

Figure 5:
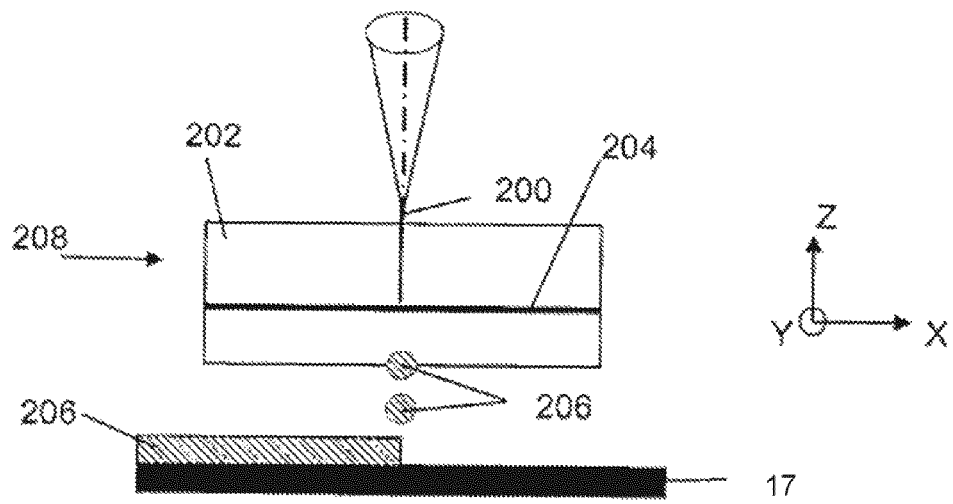
FIG. 5 depicts in cross-section, a part of an embodiment of the invention.

Referring to FIG. 5, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

Figure 6:
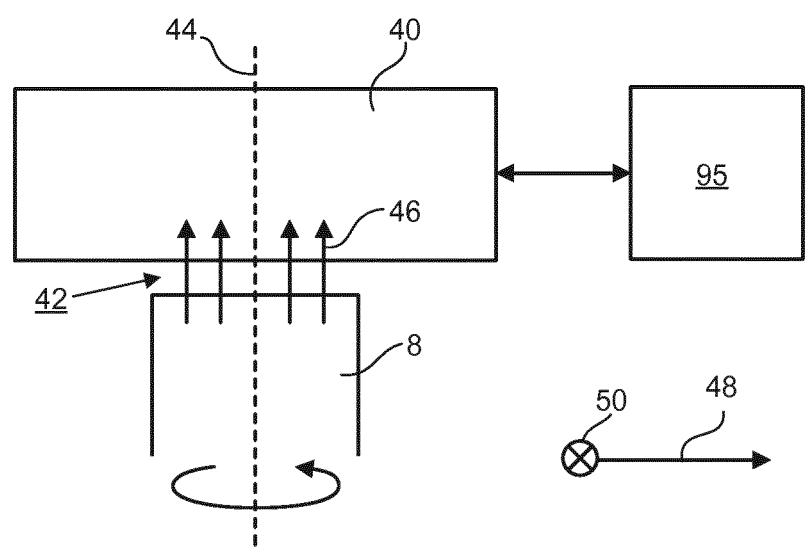
FIG. 6 depicts an example movable element suspended below a support.

FIG. 6 depicts an example arrangement in which a support 40 is configured to apply a force 46 to a movable element 8 in order to suspend the movable element 8 beneath the support 40 in a contactless manner. The force 46 thus "compensates" for the force of gravity on the movable element. In the embodiment shown, the movable element 8 is configured to rotate about axis 44 substantially parallel to the direction of gravity. In other embodiments, the movable element 8 is configured to rotate about one or more other axes and/or to undergo translational movement. In an embodiment of the type described above with reference to FIGS. 1 to 4, the movable element 8 may correspond, for example, to the frame 8 holding the field lenses 14 and the imaging lenses 18. Movement of the movable element 8 is driven by motor 11 (which may be referred to as a movable element driver).

In an embodiment, the support 40 comprises a stator element and field inducing elements mounted on the stator element (described in detail below). The field inducing elements control a magnetic field in a gap 42 between the stator element of the support 40 and the movable element 8. The field inducing elements may comprise coils or other elements to support an electrical current. The coils or other elements may be mounted on the stator element by a winding process. A support driver 95 is provided to drive the field inducing elements (e.g. to drive an electrical current through the field inducing elements). The field inducing elements induce a magnetic field in the stator element and in the gap 42 adjacent to the stator element. In an embodiment, the gap is arranged to have a thickness in the range of 0.1-10 mm, optionally 1-5 mm, optionally about 3 mm.

In an embodiment, the field inducing elements comprise a gravity compensator field inducing element and a plurality of torque compensator field inducing elements (which may or may not be separate from each other). The gravity compensator field inducing element is configured to apply a translational force to the movable element 8 (e.g. in a direction opposed to gravity) by controlling a magnetic field in the gap 42. The torque compensator field inducing elements are configured to apply a torque to the movable element by controlling the magnetic field in the gap 42. In an embodiment the gravity compensator field inducing element can be driven independently of the torque compensator field inducing elements (e.g. a current can be driven through the field inducing element while no current or a different current is driven through each of the torque compensator field inducing elements). The process of supporting the weight of the movable element 8 can thus be performed separately to the process of correcting for torque applied to the movable element 8.

In an embodiment, the torque compensator field inducing elements are configured to apply a torque about a first axis 48 substantially perpendicular to the direction of the translational force applied by the gravity compensator field inducing element (upwards in the orientation of FIG. 6). The applied torque may compensate for a torque applied to the movable element 8 from a source, for example, other than the torque compensator field inducing elements. In an embodiment, the torque compensator field inducing elements are configured to apply a torque about a second axis 50 (into the page in the orientation of FIG. 6) substantially perpendicular to the first axis 48 and to the direction of the translational force applied by the gravity compensator field inducing element (upwards in the orientation of FIG. 6). In an embodiment the torque applied about the first axis 48 can be controlled independently of the torque applied about the second axis 50. By combined application of torques about the first and second axes 48, 50, the torque compensator field inducing elements can compensate for arbitrary torques about any axis perpendicular to the direction of gravity.

The field inducing elements of the support 40 apply a force and/or torque to the movable element 8 by varying the size (strength) of the magnetic field in the gap 42. The process may be considered as based on the reluctance principle. The force and/or torque acts so as to reduce the field energy associated with a magnetic circuit defined by the stator element and the gap 42. In an embodiment, the movable element 8 comprises a material having high relative permeability, for example substantially greater than the magnetic permeability of air or vacuum. The relative permeability may be greater than 10 at room temperature and for fields less than 0.002 T for example. The material may be a magnetically soft material for example. For a given magnetic field strength, the magnetic field energy associated with the field is lower when the field traverses a material with high permeability than when the field traverses air or vacuum. By applying a magnetic field to the gap 42 a force is thereby applied to the movable element 8. The force is directed into the gap 42 (trying to reduce the size of the gap and thereby the field energy associated with the magnetic circuit).

As explained in the introductory part of the description, a gravity compensator using a permanent magnet in combination with a Lorentz actuator may be prone to a parasitic force due to an error in the magnetization of the permanent magnet. A permanent magnet on the movable element 8 may introduce an AC parasitic force (acting for example between the movable element 8 and a stationary part of the support) at a frequency corresponding to the rotational frequency or higher. A permanent magnet on the stationary part of the support may introduce a DC parasitic force. This problem is avoided or mitigated by using the above-described reluctance mechanism to provide at least part of the gravity opposing force. In addition, the accuracy of the support is improved by providing the integral torque compensation for axes perpendicular to the direction of gravity. Relative to an arrangement using a permanent magnet and a Lorentz actuator, a stray field is reduced. A stray field can disrupt a nearby element of the apparatus, for example by inducing an eddy current and/or resistive heating and/or by introducing a parasitic force.

In an embodiment, a single stator element engages both with the gravity compensator field inducing element and with the torque compensator field inducing elements. In an example of such an embodiment, the stator element comprises one or more parts that engage predominantly with the gravity compensation field inducing element (e.g. pass through one or more loops defined by the gravity compensation field inducing element) and one or more other parts that engage predominantly with the torque compensator field inducing elements (e.g. pass through loops defined by the torque compensation field inducing elements). One or more of the gravity compensator stator parts may be integral with one or more of the torque compensator stator parts. In an embodiment, a plurality of separate stator elements is provided (e.g. stator elements that are not-integral with each other and/or are spaced apart from each other). In an example of such an embodiment, one or more of the gravity compensator stator elements are separate from one or more of the torque compensator stator elements.

Figure 7:
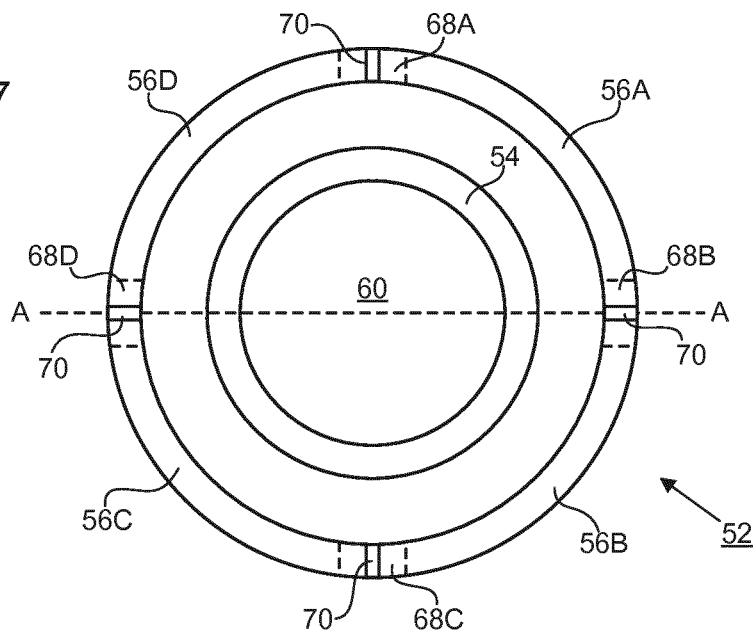
FIG. 7 is a schematic bottom view of a stator element for a support.
Figure 8:
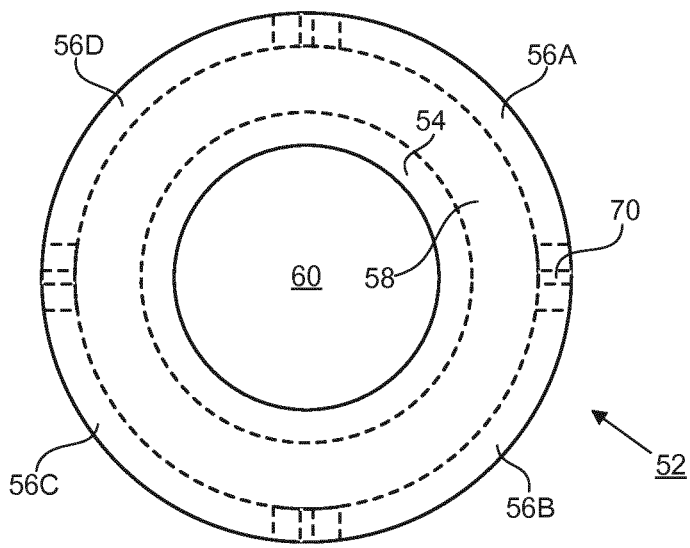
FIG. 8 is a schematic top view of the stator element of FIG. 7.
Figure 9:
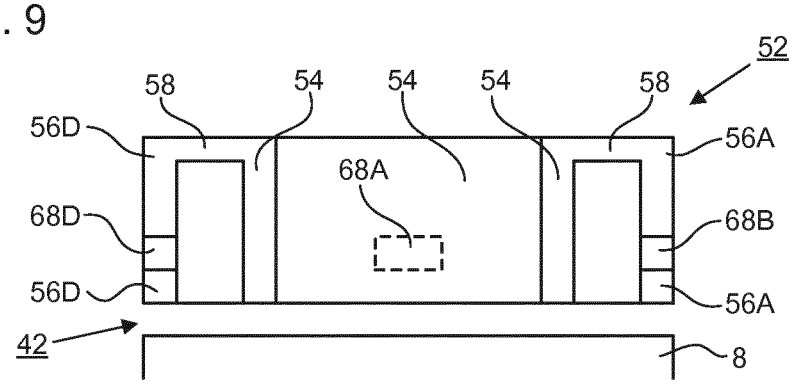
FIG. 9 is a schematic side sectional view of the stator element shown in FIG. 7.

FIGS. 7 to 9 illustrate an example of a stator element 52 that is configured to engage both with the gravity compensator field inducing element and with the torque compensator field inducing elements. FIG. 7 is a schematic bottom view of the stator element 52. FIG. 8 is a schematic top view of the stator element 52 (with hidden interfaces shown by broken lines). FIG. 9 is a schematic side sectional view along line AA of FIG. 7.

Figure 12:
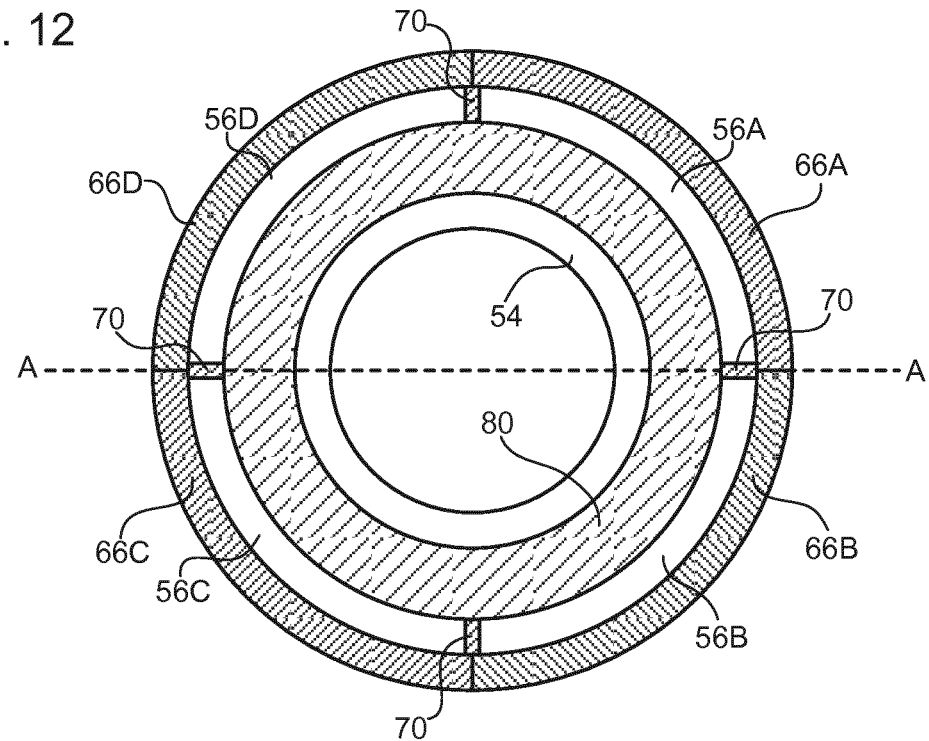
FIG. 12 is a schematic bottom view of a support comprising a stator element of the type shown in FIGS. 7 to 9 with field inducing elements of the type shown in FIGS. 10 and 11 mounted thereon.
Figure 13:
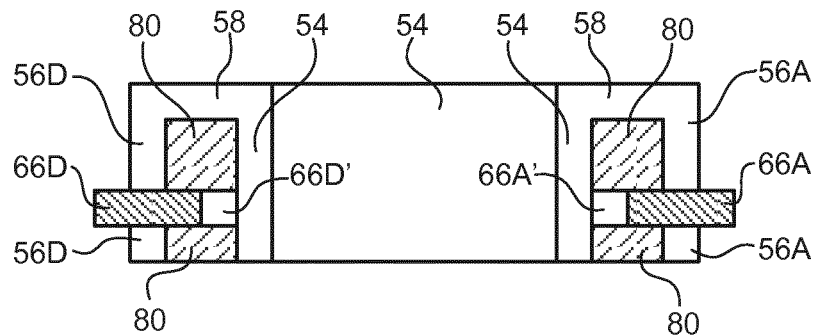
FIG. 13 is a schematic side sectional view of the support shown in FIG. 12.

The depicted stator element 52 comprises a first part 54 configured to act predominantly as a stator for a gravity compensator field inducing element. In the embodiment shown the first part 54 has a hollow cylindrical form. In an embodiment, the first part 54 takes another form. The stator element 52 shown also comprises four further parts 56A, 56B, 56C and 56D. The further parts 56A-D act predominantly as stator elements for the torque compensator field inducing elements. In the embodiment shown, each of the further parts comprises a quarter of a hollow cylinder (formed for example by dividing the cylinder by two perpendicular planes having a line of intersection along the axis of the cylinder). In the embodiments shown, the first part 54 and the further parts 56A-D are connected together by the base 58 of the stator element 52. In the embodiment shown, the base 58 provides a flat surface. The region below the base 58 and between the first part 54 and further parts 56A-D of the stator element 52 defines a trough within which gravity compensator and/or torque compensator field inducing elements can be located (as shown in FIGS. 12 and 13 for example). A cylindrical hole 60 traverses the stator element 52 in the longitudinal direction.

As can be seen from the side sectional view of FIG. 9, the first part 54 of the stator element 52 is integrally connected to the further parts 56A-D via the base 58. This approach facilitates manufacture because only a single element needs to be formed. In other embodiments, the first part 54 is separated from one or more of the further parts 56A-D.

In an embodiment, one or more of the cylindrical elements referred to above is/are axially aligned substantially parallel to the smallest dimension of the gap 42 and/or substantially parallel to the direction of the translational force applied by the gravity compensator field inducing element. In an embodiment the gap is bounded by a planar surface of the stator element 52 on one side and by a planar surface of the movable element 8 on the other side. In the arrangement shown in FIG. 9, the gap 42 takes the form of a flat, hollow cylinder (with the central missing portion corresponding to the cylindrical hole 60).

In an embodiment, the plurality of torque compensator field inducing elements are configured to control a spatial variation in the size of the magnetic field in the gap 42 between the stator element 52 and the movable element 8. Making the size of the magnetic field non-uniform for example makes it possible to apply a torque to the movable element 8 (or compensate a torque applied by another element) about one or more axes substantially perpendicular to the direction of gravity. For example, driving a current through a field inducing element (e.g. coil) in such a way as to decrease the field in the gap (i.e. by opposing a field applied separately by the gravity compensator field inducing element) in a first region of the gap will tend to reduce the attractive force in the first region relative to another region. This results in a torque being applied to the movable element 8. In order to avoid a net change in the force opposing gravity and/or to increase the size of the torque applied, a current may be driven through another field inducing element in such a way as to increase the field in a second region of the gap 42 by a corresponding amount. In an embodiment, substantially equal and opposite forces are applied at the first and second regions, resulting in a torque about an axis lying in between the two regions that does not affect the gravity compensation. In other embodiments, the forces applied by the torque compensator field inducing elements are deliberately controlled so as to provide a net force in the direction of gravity. Thus, the torque compensator field inducing elements can be configured to provide control of the force substantially parallel to gravity that is independent of the force applied by the gravity compensator field inducing element. In an embodiment, the current applied to the gravity compensator field inducing element is kept substantially constant (e.g. at a level equal or approximately equal to the nominal weight of the movable element 8), while a dynamic variation in the force applied to the movable element substantially parallel to gravity is corrected using the torque compensator field inducing elements.

Figure 10:
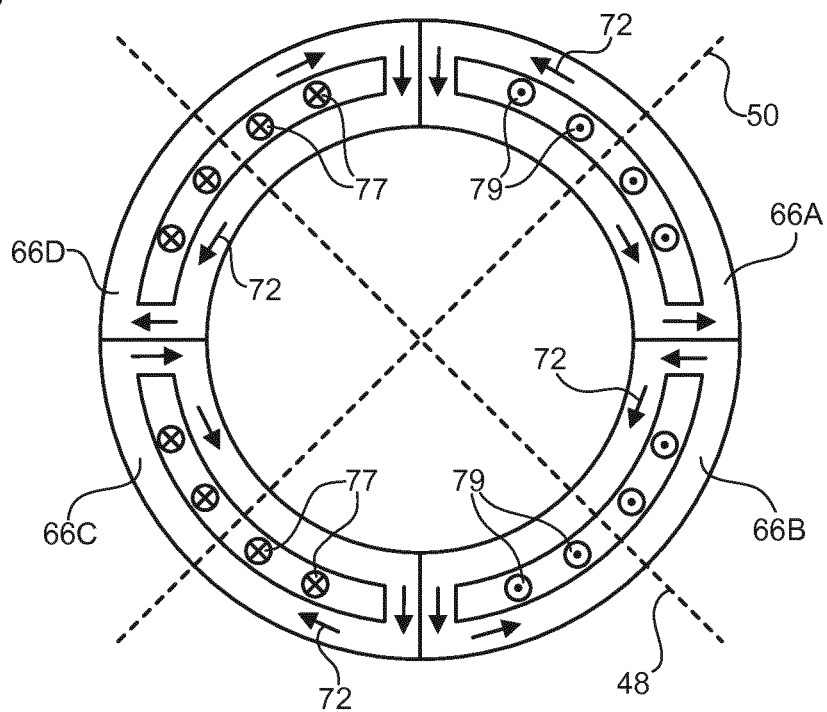
FIG. 10 is a schematic top view of a plurality of torque compensator field inducing elements suitable for engagement with the stator element depicted in FIGS. 7 to 9.

FIG. 10 depicts an example plurality of torque compensator field inducing elements (e.g. coils). In the example shown, four field inducing elements 66A-D are provided. The four field inducing elements 66A-D are configured so that they can be mounted on a stator element 52 having the geometry shown in FIGS. 7 to 9. In particular, the field inducing element 66A is configured so that it can be mounted (e.g. wound) onto the further part 56A of the stator element 52, field inducing element 66B is configured to be mounted on the further part 56B, field inducing element 66C is configured to be mounted on the further part 56C, and field inducing element 66D is configured to be mounted on the further part 56D. In the embodiment shown, openings 68A-D are provided in the stator element 52 to allow the field inducing element 56A-D to be mounted (e.g. wound) around the stator parts 56A-B. For example, it can be seen that the field inducing element 66A will pass through openings 68A and 68B, field inducing element 66B will pass through openings 68B and 68C, field inducing element 66C will pass through openings 68C and 68D, and field inducing element 66D will pass through openings 68D and 68A. In an embodiment, slots 70 are provided that extend from the opening 68A-D to the leading edge of the stator parts 56A-D (i.e. upwards in the orientation shown in FIG. 9). The slots 70 thus help ensure that the openings are not surrounded by a closed loop of material. The slots may reduce an eddy current and/or facilitate a process of mounting (e.g. winding) the coils 66A-D onto the stator element 52.

In the arrangement of FIG. 10, a torque about the first axis 48 can be applied by arranging for the current 72 in the field inducing element 66A to circulate in the opposite sense to the current 72 in the field inducing element 66C. In this way, the magnetic field 79 generated by the current 72 in the field inducing element 66A will be opposite in direction (out of the page in the example shown) to the magnetic field 77 generated by the current 72 in the field inducing element 66C (into the page in the example shown). The magnetic field in the region of the gap 42 directly below the field inducing element 66A will thus be changed in an opposite sense to the magnetic field in the region of the gap 42 directly below the field inducing element 66C. The resulting forces will apply a torque about the first axis 48. A torque can be applied about the second axis 50 by arranging for the current 72 in the field inducing element 66B to circulate in an opposite sense to the current 72 in the field inducing element 66D (see magnetic field contributions 79 and 77 respectively for the field inducing elements 66B and 66D).

In an embodiment, the torque compensator field inducing elements comprises only three field inducing elements rather than, for example, four. In an example embodiment of this type, the three field inducing elements are arranged in the same way as in FIG. 10 except that the cylinder is divided into three parts rather than four parts (each therefore extending through 120° rather than through 90°). By suitably combining the forces applied by the three field inducing elements it is possible to selectively apply torques about the first and second axis 48, 50 as required. In other embodiments, the torque compensator field inducing elements comprises more than four field inducing elements.

In an embodiment, one or more gravity compensator field inducing elements are provided that are separate from the torque compensator field inducing elements. In an embodiment, the gravity compensator field inducing element is drivable separately from the torque compensator field inducing elements.

Figure 11:
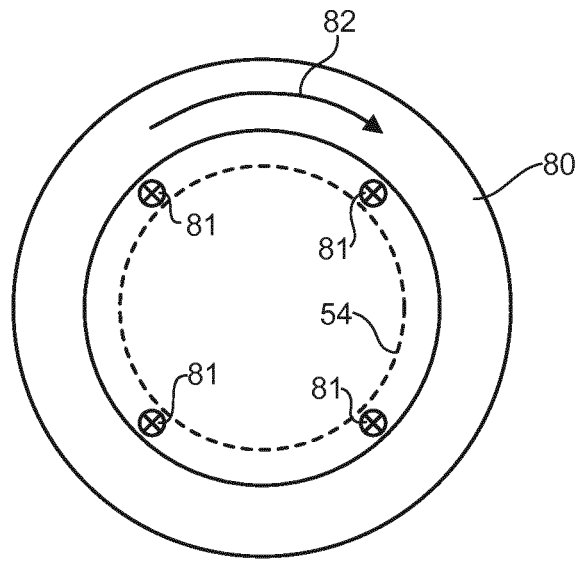
FIG. 11 is a schematic top view of a field inducing element of a gravity compensator suitable for engagement with the stator element depicted in FIGS. 7 to 9.

FIG. 11 is a schematic top view of an example gravity compensator field inducing element 80. Arrow 82 shows an example direction of current circulating in the field inducing element 80. In the example shown, the resulting field 81 would be directed into the page and would be distributed predominantly in the portion of the stator element 54 radially inside of the element 80 (shown for reference by broken line 54). The field inducing element 80 is cylindrical in the example shown and dimensioned so as to be mountable within the trough below the base 58 of stator element 52 of the type shown in FIGS. 7 to 9. The axis of the cylindrical field inducing element 80 when mounted thus coincides with the axis of the cylindrical part 54 of the stator element 52. Increasing the size of current 82 increases the size of the magnetic field in the gap 42 and increases the size of the attractive force (i.e. the reluctance-based force opposing gravity) between the stator element 52 and the movable element 8. Decreasing the size of the current 82 decreases the size of the attractive force.

FIG. 12 is a schematic bottom view of the stator element shown in FIGS. 7 to 9 with the field inducing elements shown in FIGS. 10 and 11 mounted thereon. FIG. 13 is a schematic side sectional view along broken line A-A of the assembly of FIG. 12. As can be seen, in this example embodiment two cylindrical field inducing element 80 are provided. The two cylindrical field inducing elements 80 are axially aligned. The two cylindrical field inducing elements sandwich radially inner portions of the torque compensator field inducing elements 66A-D. In the sectional view shown, only portions of the torque compensator field inducing elements 66A and 66D are visible (parts 66A' and 66D' represent views of the radially inner surface of the torque compensator field inducing elements that are curving away into the plane of the page). In an embodiment, a single field inducing element 80 is provided or more than two field inducing elements 80 are provided. In an embodiment, more than one layer of the torque compensator field inducing element 66A-D are provided, for example sandwiching one or more gravity compensator field inducing elements.

Figure 14:
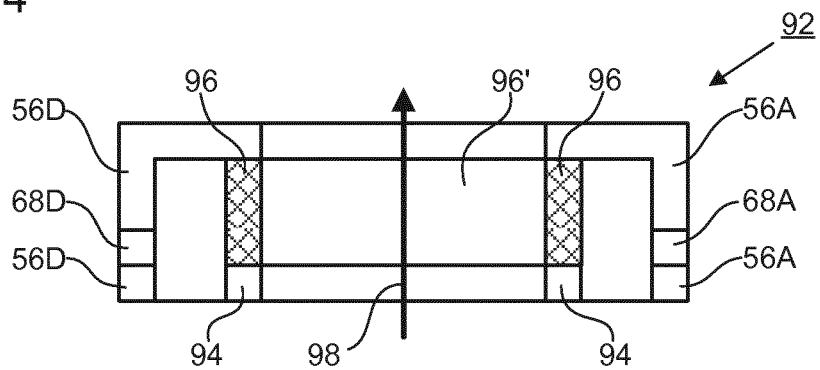
FIG. 14 is a schematic side sectional view of a stator element comprising a permanent magnet.

FIG. 14 illustrates an embodiment in which a permanent magnet 96 is incorporated into a stator element 92. A support using such a stator element 92 may be referred to as a hybrid reluctance actuator. In the example shown, the geometry and dimensions of the stator element 92 are the same as the geometry and dimensions of the stator element 52 depicted in FIGS. 7 to 9, 12 and 13. A difference is that part of the material forming the stator element 92 comprises permanent magnet material, whereas in the stator element 52 all of the stator element is formed from soft magnetic material. The stator element 92 is thus suitable for receiving gravity and torque compensator field inducing elements having the geometry depicted in FIGS. 10 and 11. In an embodiment, the stator element with a permanent magnet may have a different geometry from the stator element 52 depicted in FIGS. 7 to 9, 12 and 13.

In the embodiment of FIG. 14, the permanent magnet 96 has a hollow cylindrical form. Portion 96' represents the part of the magnet 96 that is curving (concave) into the plane of the page. Relative to the stator element 52 depicted in FIGS. 7 to 9, 12 and 13, the permanent magnet 96 may be considered as notionally replacing a portion of the stator element part 54. In an embodiment, the permanent magnet 96 is configured to provide at least a portion of the force 98 that opposes the force of gravity on the movable element 8 by contributing to the field in the gap 42 between the stator element 52 and the movable element 8. In an embodiment, the portion of the force provided by the permanent magnet represents the majority of the force required (e.g. 900 N of a total requirement of 1100 N in an embodiment). The current provided through the gravity compensator field inducing element 80 may thus be reduced. In an embodiment, the gravity compensator field inducing element 80 is required only to fine tune the force to support the movable element 8 and/or to correct for dynamic variation in the force applied to the movable element 8 and/or in the position of the movable element 8 substantially parallel to the direction of gravity. In an embodiment, no separate gravity compensator field inducing element is provided. In an example of such an embodiment, fine tuning (or correction of dynamic variation in force or position) of the gravity compensation is performed by other means. In an embodiment, fine tuning (or correction of dynamic variation in force or position) of the gravity compensation is performed by field inducing elements that operate both as torque compensator field inducing elements and as gravity compensator field inducing elements. For example, field inducing elements of the type shown in FIG. 10 could be used to fine tune the gravity compensation and could therefore be considered as both gravity compensator field inducing elements and torque compensator field inducing elements.

The presence of the permanent magnet 96 may reduce the size of the current driven through a field inducing element to provide the gravity opposing force. Electrical loss and/or heat load associated with the current is therefore reduced. Additionally, the negative stiffness associated with the reluctance mechanism is lower in comparison to a support having a stator element with no permanent magnet. This is because with a permanent magnet in the magnetic circuit instead of soft magnetic material, the magnetic field variation (force variation) as a function of gap size is much smaller due to the fact that the permanent magnet material will have a relative permeability (typically in the region of 1.05, similar to air) that is much lower than the relative permeability of a soft magnetic material. A variation in the size of the gap thus results in relatively less variation in magnetic resistance in the system than would be the case in an embodiment based on a stator element formed purely from soft magnetic material (with no permanent magnet).

Using gravity compensator field inducing elements purely to correct for dynamic variation in the net force substantially parallel to gravity improves the accuracy of this process and potentially simplifies electronics (e.g. no high power electronics may be required because the maximum power that the electronics needs to deal with is much lower) relative to the case where the gravity compensator field inducing elements have to compensate the entire weight of the movable element and correct for dynamic force variation.

Further, use of a stator element comprising a permanent magnet removes (or reduces the predominance of) the non-linear relationship between the size of a force generated by driving a current through a field inducing element mounted on the stator element (e.g. a field inducing element configured purely to apply a translational force, such as a gravity compensator field inducing element, or a field inducing element configured selectively to apply either or both of a translation force or a torque), thus facilitating for example the control of dynamic forces acting on the movable element. Addition of the permanent magnet effectively changes the system from one being based purely on reluctance to a hybrid system. In a pure reluctance system, the size of force and/or torque is predominantly proportional to the square of the current, whereas in a hybrid system the size of force and/or torque is predominantly proportional to the current (not squared).

The predominantly linear relationship between current and corrective force (e.g. AC or varying force) can also apply where a permanent magnet is not used but where a main field inducing element is used to compensate all or a majority of the gravity force and an additional field inducing element (e.g. one or more of the torque compensator field inducing elements), or an additional current superimposed on the current through the main field inducing element, is used to provide the corrective force, as long as the corrective force/torque is not too high (e.g. the corrective force is at least 80% smaller than the force used to compensate gravity).

As discussed above, a permanent magnet is prone to a magnetization error, for example an error in the direction of magnetization. In an embodiment using a permanent magnet 96, such an error is at least partially compensated by suitable driving of the torque compensator field inducing elements. Additionally or alternatively, a field homogenizing element 94 is provided between the permanent magnet 96 and the gap 42 between the stator element and the movable element 8. In the example shown in FIG. 14, the field homogenizing element 94 has a hollow cylindrical form corresponding to the hollow cylindrical form of the permanent magnet 96 (having the substantially same size and/or geometry when viewed along the cylinder axis). In an embodiment, the field homogenizing element 94 comprises a material of high relative permeability, e.g. a magnetically soft material. In an embodiment, the field homogenizing element 94 comprises a plate of magnetically soft material. A magnetically soft material is easily magnetized but does not retain its magnetization. Examples of magnetically soft materials include ferromagnetic material, for example based on an iron and nickel alloy, or ferrimagnetic material, for example based on a ceramic oxide (above the Curie temperature). In an embodiment, the field homogenizing element has a relative permeability of 10 or greater (at room temperature and for applied fields of less than 0.002 T).

In an embodiment, there is provided a support for a movable element, comprising: a stator element; a gravity compensator field inducing element mounted on the stator element, the gravity compensator field inducing element configured to apply a translation force to the movable element by controlling a magnetic field in a gap between the stator element and the movable element; and a plurality of torque compensator field inducing elements mounted on the stator element, the torque compensator field inducing elements configured to apply a torque to the movable element by controlling a magnetic field in the gap between the stator element and the movable element, the torque being about a first axis substantially perpendicular to the direction of the translational force applied by the gravity compensator field inducing element.

In an embodiment, the torque compensator field inducing elements are further configured to apply a torque about a second axis substantially perpendicular to the first axis and to the direction of the translational force applied by the gravity compensator field inducing element. In an embodiment, the stator element has a first part configured to act predominantly as a stator for the gravity compensator field inducing element. In an embodiment, the stator element further comprises a further part, the further part configured to act predominantly as a stator for one of the torque compensator field inducing elements. In an embodiment, the first part of the stator element is integral with the further part of the stator element. In an embodiment, one or more of the field inducing elements comprises a coil to conduct an electrical current. In an embodiment, the torque compensator field inducing elements are configured to control a spatial variation in the size of the magnetic field in the gap between the stator element and the movable element. In an embodiment, the torque compensator field inducing elements comprises a first field inducing element that is configured to control the size of the magnetic field in a first region and a second field inducing element that is configured to control the size of the magnetic field in a second region, the first region being separated from the second region in a direction perpendicular to the direction of the translational force applied by the gravity compensator field inducing element. In an embodiment, the first field inducing element and the second field inducing element are configured to apply a torque about the first axis by arranging for the size of the magnetic field in the first region to be different to the size of the magnetic field in the second region. In an embodiment, the size of the magnetic field is arranged to be lower than an average size of the magnetic field in the gap in the first region, and to be higher than the average size of the magnetic field in the gap in the second region. In an embodiment, the difference in force applied to the movable element due to the change in the magnetic field in the first region is substantially equal and opposite to the difference in force applied to the movable element due to the change in the magnetic field in the second region. In an embodiment, the torque compensator field inducing elements further comprise a third field inducing element that is configured to control the size of the magnetic field in a third region and a fourth field inducing element that is configured to control the size of the magnetic field in a fourth region, the third and fourth regions each being separated from each other and from each of the first and second regions in a direction perpendicular to the direction of the translational force applied by the gravity compensator field inducing element. In an embodiment, the third field inducing element and the fourth field inducing element are configured to apply a torque about a second axis substantially perpendicular to the first axis and to the direction of the translational force applied by the gravity compensator field inducing element by arranging for the size of the magnetic field in the third region to be different to the size of the magnetic field in the fourth region. In an embodiment, the torque compensator field inducing elements comprise three field inducing elements, each configured to control the size of the magnetic field in a different region of the gap, the three field inducing elements being individually controllable in order selectively to apply a torque about either or both of first and second axes perpendicular to each other and to the direction of the translational force applied by the gravity compensator field inducing element. In an embodiment, the stator element comprises a permanent magnet configured to provide a magnetic field in the gap between the stator element and the movable element. In an embodiment, the magnetic field provided by the permanent magnet is substantially parallel in the gap to the magnetic field provided by the gravity compensator field inducing element. In an embodiment, the support further comprises a field homogenizing element between the permanent magnet and the gap between the stator element and the movable element. In an embodiment, the field homogenizing element comprises a magnetically soft material. In an embodiment, the gravity compensator field inducing element is formed from two or more of the torque compensator field inducing elements and is configured only to correct for dynamically varying translational forces acting in the direction of gravity, the weight of the movable element being supported predominantly by the field supplied by the permanent magnet. In an embodiment, the support further comprises a support driver configured to drive an electrical current through the field inducing elements, the support driver configured to drive the gravity compensator field inducing element so as only to provide a translational force to the movable element, and to drive the torque compensator field inducing elements to compensate both for torque and for dynamical variation in the net force applied to the movable element substantially parallel to the direction of the translational force applied by the gravity compensator field inducing element. In an embodiment, the support further comprises a support driver configured to drive an electrical current through the field inducing elements.

In an embodiment, there is provided a support system comprising a moveable element; and a support as disclosed herein configured to support the movable element. In an embodiment, a support system further comprises a movable element driver configured to drive movement of the movable element. In an embodiment, the movable element driver is configured to impart rotational movement to the movable element. In an embodiment, the rotational movement is about a direction substantially parallel to the direction of the translational force applied by the gravity compensator field inducing element. In an embodiment, the movable element driver is configured to impart translational movement to the movable element. In an embodiment, the movable element is supported contactlessly. In an embodiment, the support is configured to apply a force that is substantially equal to the force of gravity on the movable element. In an embodiment, the support system is configured such that the movable element is suspended in a contactless manner below the support.

In an embodiment, there is provided an exposure apparatus comprising a projection system configured to project each of a plurality of radiation beams onto a target, the projection system comprising a stationary element and a movable element; and a support as disclosed herein configured to support the movable element.

In an embodiment, there is provided an exposure apparatus, comprising: a projection system for projecting each of a plurality of radiation beams onto a target, the projection system comprising a stationary element and a movable element; a stator element; a gravity compensator field inducing element mounted on the stator element; and a plurality of torque compensator field inducing elements mounted on the stator element, wherein: the gravity compensator field inducing element is configured to apply a translational force to the movable element by controlling a magnetic field in a gap between the stator element and the movable element; and the plurality of torque compensator field inducing elements are configured to apply a torque to the movable element by controlling a magnetic field in the gap between the stator element and the movable element, the torque being about a first axis perpendicular to the direction of the translational force applied by the gravity compensator field inducing element.

In an embodiment, the movable element is configured to rotate relative to the stationary element. In an embodiment, the exposure apparatus further comprises a programmable patterning device configured to provide the plurality of radiation beams. In an embodiment, the programmable patterning device comprises a plurality of self-emissive contrast devices.

In an embodiment, there is provided a method of supporting a movable element, comprising: driving a gravity compensator field inducing element mounted on a stator element to apply a translational force to the movable element by controlling a magnetic field in a gap between the stator element and the movable element; and driving a plurality of torque compensator field inducing elements mounted on the stator element to apply a torque to the movable element by controlling a magnetic field in the gap between the stator element and the movable element, the torque being about a first axis substantially perpendicular to the direction of the translational force applied by the gravity compensator field inducing element.

In an embodiment, there is provided a device manufacturing method, comprising: projecting each of a plurality of radiation beams onto a target, the projection system comprising a stationary element and a movable element; driving a gravity compensator field inducing element mounted on a stator element to apply a translational force to the movable element by controlling a magnetic field in a gap between the stator element and the movable element; and driving a plurality of torque compensator field inducing elements mounted on the stator element to apply a torque to the movable element by controlling a magnetic field in the gap between the stator element and the movable element, the torque being about a first axis substantially perpendicular to the direction of the translational force applied by the gravity compensator field inducing element.

In an embodiment, the field homogenizing element 94 reduces the effect of an error, for example an alignment error, in the magnetization of the permanent magnet 96. In an embodiment, the material of the field homogenizing element 94 is such as to redirect magnetic field lines leaving the permanent magnet so that they become more evenly spaced and/or more perpendicular to the gap 42 between the stator element and the movable element 8. A material with high magnetic permeability facilitates this functionality because field lines will tend to leave such a material perpendicularly. An unwanted parasitic force can thereby be reduced or minimized even in the presence of a permanent magnet.

In accordance with a device manufacturing method, a device, such as a display, integrated circuit or any other item may be manufactured from the substrate on which the pattern has been projected.

Although specific reference may be made in this text to the use of lithographic or exposure apparatus in the manufacture of ICs, it should be understood that the lithographic or exposure apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

The descriptions above are intended to be illustrative, not limiting. Thus, it will be apparent to one skilled in the art that modifications may be made to the invention as described without departing from the scope of the claims set out below.

The invention claimed is:

1. A support for a movable element, the support comprising:
  a stator element;
  a gravity compensator field inducing element mounted on the stator element, the gravity compensator field inducing element configured to apply a translational force, in a direction with at least a component parallel to the direction of gravity, to the movable element by controlling a magnetic field in a gap between the stator element and the movable element; and
  a plurality of torque compensator field inducing elements, separate from the gravity compensator field inducing element, mounted on the stator element, the torque compensator field inducing elements configured to apply a torque to the movable element by controlling a magnetic field in the same gap between the stator element and the movable element, the torque being about a first axis substantially perpendicular to the direction of the translational force applied by the gravity compensator field inducing element.

2. The support of claim 1, wherein the torque compensator field inducing elements are further configured to apply a torque about a second axis substantially perpendicular to the first axis and to the direction of the translational force applied by the gravity compensator field inducing element.

3. The support of claim 1, wherein the stator element has a first part configured to act as a stator for the gravity compensator field inducing element.

4. The support of claim 3, wherein the stator element further comprises a further part, the further part configured to act as a stator for one of the torque compensator field inducing elements.

5. The support of claim 4, wherein the first part of the stator element is integral with the further part of the stator element.

6. The support of claim 1, wherein the torque compensator field inducing elements are configured to control a spatial variation in the size of the magnetic field in the gap between the stator element and the movable element.

7. The support of claim 1, wherein the torque compensator field inducing elements comprises a first field inducing element that is configured to control the size of the magnetic field in a first region and a second field inducing element that is configured to control the size of the magnetic field in a second region, the first region being separated from the second region in a direction perpendicular to the direction of the translational force applied by the gravity compensator field inducing element.

8. The support of claim 7, wherein the first field inducing element and the second field inducing element are configured to apply a torque about the first axis by arranging for the size of the magnetic field in the first region to be different to the size of the magnetic field in the second region.

9. The support of claim 8, wherein the size of the magnetic field is arranged to be lower than an average size of the magnetic field in the gap in the first region, and to be higher than the average size of the magnetic field in the gap in the second region.

10. The support of claim 9, wherein the difference in force applied to the movable element due to the change in the magnetic field in the first region is substantially equal and opposite to the difference in force applied to the movable element due to the change in the magnetic field in the second region.

11. The support of claim 1, wherein the torque compensator field inducing elements comprise three field inducing elements, each configured to control the size of the magnetic field in a different region of the gap, the three field inducing elements being individually controllable in order selectively to apply a torque about either or both of first and second axes perpendicular to each other and to the direction of the translational force applied by the gravity compensator field inducing element.

12. The support of claim 1, wherein the stator element comprises a permanent magnet configured to provide a magnetic field in the gap between the stator element and the movable element.

13. The support of claim 12, further comprising a field homogenizing element between the permanent magnet and the gap between the stator element and the movable element.

14. The support of claim 12, wherein the gravity compensator field inducing element comprises two or more of the torque compensator field inducing elements and is configured only to correct for dynamically varying translational forces acting in the direction of gravity, the majority of the weight of the movable element being supported by the field supplied by the permanent magnet.

15. The support of claim 1, further comprising a support driver configured to drive an electrical current through the field inducing elements, the support driver configured to drive the gravity compensator field inducing element so as only to provide a translational force to the movable element, and to drive the torque compensator field inducing elements to compensate both for torque and for dynamical variation in the net force applied to the movable element substantially parallel to the direction of the translational force applied by the gravity compensator field inducing element.

16. An exposure apparatus, comprising:
  a projection system configured to project each of a plurality of radiation beams onto a target, the projection system comprising a stationary element and a movable element;
  a stator element;
  a gravity compensator field inducing element mounted on the stator element; and
  a plurality of torque compensator field inducing elements, separate from the gravity compensator field inducing element, mounted on the stator element, wherein:
  the gravity compensator field inducing element is configured to apply a translational force, in a direction with at least a component parallel to the direction of gravity, to the movable element by controlling a magnetic field in a gap between the stator element and the movable element; and
  the plurality of torque compensator field inducing elements are configured to apply a torque to the movable element by controlling a magnetic field in the same gap between the stator element and the movable element, the torque being about a first axis perpendicular to the direction of the translational force applied by the gravity compensator field inducing element.

17. An apparatus according to claim 16, wherein the movable element is configured to rotate relative to the stationary element.

18. An apparatus according to claim 16, further comprising:
a programmable patterning device configured to provide the plurality of radiation beams.

19. An apparatus according to claim 18, wherein the programmable patterning device comprises a plurality of self-emissive contrast devices.

20. A device manufacturing method, comprising:
projecting each of a plurality of radiation beams onto a target, the projection system comprising a stationary element and a movable element;

driving a gravity compensator field inducing element mounted on a stator element to apply a translational force, in a direction with at least a component parallel to the direction of gravity, to the movable element by controlling a magnetic field in a gap between the stator element and the movable element; and driving a plurality of torque compensator field inducing elements, separate from the gravity compensator field inducing element, mounted on the stator element to apply a torque to the movable element by controlling a magnetic field in the same gap between the stator element and the movable element, the torque being about a first axis substantially perpendicular to the direction of the translational force applied by the gravity compensator field inducing element.

* * * * *